United States Patent
Liu et al.

(10) Patent No.: US 10,433,424 B2
(45) Date of Patent: Oct. 1, 2019

(54) ELECTRONIC MODULE AND THE FABRICATION METHOD THEREOF

(71) Applicant: CYNTEC CO., LTD., Hsinchu (TW)

(72) Inventors: Chun-Tiao Liu, Hsinchu (TW); Bau-Ru Lu, Hsinchu (TW)

(73) Assignee: CYNTEC CO., LTD, Hsinchu (TW)

(*) Notice: Subject to any disclaimer, the term of this patent is extended or adjusted under 35 U.S.C. 154(b) by 34 days.

(21) Appl. No.: 14/883,651

(22) Filed: Oct. 15, 2015

(65) Prior Publication Data
US 2016/0113117 A1   Apr. 21, 2016

Related U.S. Application Data

(60) Provisional application No. 62/064,480, filed on Oct. 16, 2014.

(51) Int. Cl.
| | |
|---|---|
| *H05K 1/18* | (2006.01) |
| *H05K 1/02* | (2006.01) |
| *H05K 3/28* | (2006.01) |

(52) U.S. Cl.
CPC ............. *H05K 1/183* (2013.01); *H05K 1/181* (2013.01); *H05K 1/185* (2013.01); *H01L 2224/16225* (2013.01); *H01L 2224/16235* (2013.01); *H01L 2924/15153* (2013.01); *H01L 2924/15313* (2013.01); *H01L 2924/181* (2013.01); *H01L 2924/19105* (2013.01); *H05K 1/0203* (2013.01); *H05K 3/284* (2013.01); *H05K 2201/1003* (2013.01); *H05K 2203/1316* (2013.01); *Y02P 70/611* (2015.11)

(58) Field of Classification Search
CPC ...... H05K 1/0203; H05K 1/181; H05K 1/183; H05K 1/185; H05K 2201/1003; H05K 2203/1316; H05K 3/284
See application file for complete search history.

(56) References Cited

U.S. PATENT DOCUMENTS

| | | | | |
|---|---|---|---|---|
| 5,708,566 A | * | 1/1998 | Hunninghaus | H05K 1/0206 174/252 |
| 6,975,516 B2 | * | 12/2005 | Asahi | H01L 21/6835 174/258 |
| 7,858,441 B2 | * | 12/2010 | Lin | H01L 23/49816 438/107 |
| 8,450,853 B2 | * | 5/2013 | Uchiyama | H01L 21/563 257/692 |
| 8,592,689 B2 | * | 11/2013 | Shimada | H05K 1/0228 174/260 |

(Continued)

*Primary Examiner* — James Wu
*Assistant Examiner* — Michael A Matey
(74) *Attorney, Agent, or Firm* — Min-Lee Teng; Litron Patent & Trademark Office

(57) ABSTRACT

An electronic module is disclosed. The electronic module includes a substrate, a plurality of electronic components electrically connected to a first side of the substrate, and another plurality of electronic components embedded in the substrate. In some other embodiments, the electronic module further comprises a heat sink disposed on at least one of the plurality of electronic components to dissipate the heat generated by the at least one of the plurality of electronic components. And, in some other embodiment, the electronic module further comprises a molding body disposed on the plurality of electronic components and, in further embodiments, the heat sink.

13 Claims, 7 Drawing Sheets

(56) References Cited

U.S. PATENT DOCUMENTS

| | | | | |
|---|---|---|---|---|
| 8,872,041 B2* | 10/2014 | Lee | ........................ | H05K 1/186 |
| | | | | 174/250 |
| 9,107,290 B1* | 8/2015 | Chen | .................. | H01L 23/49811 |
| 9,406,658 B2* | 8/2016 | Lee | ........................ | H01L 25/16 |
| 2005/0047094 A1* | 3/2005 | Hsu | ........................ | H01L 23/367 |
| | | | | 361/704 |
| 2005/0146854 A1* | 7/2005 | Ikuta | ................... | H01L 23/3677 |
| | | | | 361/719 |
| 2005/0255303 A1* | 11/2005 | Sawatari | ............... | H01L 23/142 |
| | | | | 428/209 |
| 2006/0255440 A1* | 11/2006 | Miyazaki | .......... | H01L 23/49822 |
| | | | | 257/679 |
| 2006/0261472 A1* | 11/2006 | Kimura | ................... | H01L 24/97 |
| | | | | 257/724 |
| 2006/0279395 A1* | 12/2006 | Lee | ........................... | H01F 1/26 |
| | | | | 336/221 |
| 2008/0309442 A1* | 12/2008 | Hebert | .................. | H01F 27/292 |
| | | | | 336/65 |
| 2010/0140736 A1* | 6/2010 | Lin | ...................... | H01L 23/3128 |
| | | | | 257/528 |
| 2010/0213616 A1* | 8/2010 | Uchiyama | ............. | H01L 21/563 |
| | | | | 257/773 |
| 2011/0193491 A1* | 8/2011 | Choutov | ............ | H05B 33/0803 |
| | | | | 315/291 |
| 2011/0241215 A1* | 10/2011 | Sankman | ............ | H01L 21/6835 |
| | | | | 257/773 |
| 2012/0024583 A1* | 2/2012 | Lee | ........................ | H05K 1/186 |
| | | | | 174/260 |
| 2012/0281379 A1* | 11/2012 | Shimada | ............... | H01L 21/486 |
| | | | | 361/782 |
| 2015/0071470 A1* | 3/2015 | Link | ...................... | H04R 25/65 |
| | | | | 381/322 |

* cited by examiner

ELECTRONIC MODULE AND THE FABRICATION METHOD THEREOF

CROSS-REFERENCES TO RELATED APPLICATIONS

This application claims the benefit of U.S. Provisional Patent Application No. 62/064,480 filed on Oct. 16, 2014, which is hereby incorporated by reference herein and made a part of specification.

BACKGROUND OF THE INVENTION

1. Field of the Invention

The present invention relates to an electronic module, and more particularly, an electronic module having electronic components embedded in the substrate.

2. Description of the Prior Art

As electronic technology advances, the number of features needed to fit in a single electronic device also increases. The increased number of features would mean a need for a more complex electronic circuitry to build electronic devices as well as a need for a better power management system to power the increased number of electronic modules of the complex electronic circuitry. Some examples of the electronic modules include power management system such as DC-DC converters and point of load (POL) converters. To build a better power management system to power more electronic modules, the circuit of the power management system would need to be improved and more electronic components may be needed to build the circuit of the power management system. The required area of a substrate where the power management system is formed increases. For an electronic device, the area of the substrate would depend on the size of portable the electronic device, i.e. cell phones and tablets. Thus, there is a need to develop a way to form the complex electronic circuitry within a limited substrate area of the electronic device.

SUMMARY OF THE INVENTION

One objective of the present invention is to reduce the size of an electronic module capable of being used for a DC-DC converter or a point ofload (POL) converter and the area of the substrate contained therein while increasing the heat dissipation capability of the DC-DC converters or the point of load (POL) converter.

A first embodiment of the present invention presents an electronic module. The electronic module comprises a substrate, a first plurality of electronic components embedded inside the substrate, and a second plurality of electronic components electrically connected to a first side of the substrate.

In one embodiment, the electronic module is a DC-DC converters or a point of load (POL) converter.

In one embodiment, the electronic module further comprising a molding body formed on the first side of the substrate to enclose the second plurality of electronic components electrically connected to the first side of the substrate.

In one embodiment, the first plurality of electronic components embedded inside the substrate includes a discrete inductor having a magnetic body.

In one embodiment, the second plurality of electronic components electrically connected to a first side of the substrate includes a discrete inductor having a magnetic body.

A second embodiment of the present invention presents an electronic module. The electronic module comprises a substrate, a first plurality of electronic components embedded inside the substrate, a second plurality of electronic components electrically connected to a first side of the substrate, and a third plurality of electronic components disposed on corresponding recesses on a second side of the substrate.

A third embodiment of the present invention presents an electronic module. The electronic module comprises a substrate, a plurality of electronic components disposed on the substrate, and a heat sink disposed on at least one of the plurality of electronic components.

A fourth embodiment of the present invention presents a method to fabricate an electronic module. The method comprises: providing a substrate; embedding a first plurality of electronic components inside the substrate; disposing a second plurality of discrete electronic components on a first side of the substrate and electrically connects the first side of the substrate; and forming a molding body on the first side of the substrate to enclose the second plurality of electronic components electrically connected to the first side of the substrate.

A fifth embodiment of the present invention presents an electronic device. The electronic device comprises: an inductor having a body; a heatsink, wherein at least one part of the heatsink is disposed on a surface of the body of the inductor.

In one embodiment, the first part of the heat sink is adhered on the first surface by a conductive and adhesive layer.

In one embodiment, the first part of the heat sink is extended to a second surface adjacent to the first surface of the body of the inductor.

A sixth embodiment of the present invention presents an electronic module. The electronic module comprises: a substrate; an inductor having a body disposed over the substrate; a heatsink, wherein at least one part of the heatsink is disposed on a surface of the body of the inductor.

In one embodiment, at least one electronic component disposed between the bottom surface of the body of the inductor and the substrate.

In one embodiment, the first part of the heat sink is adhered on the top surface and extended to a lateral surface of the body of the inductor.

In one embodiment, the first part of the heat sink is electrically connected to a ground on the substrate.

In one embodiment, the first part of the heat sink is disposed on the top surface of the substrate and extended to a lateral surface of the body of the inductor.

In one embodiment, a second part of the heat sink is disposed on the top surface of the substrate and extended to a lateral surface of the body of the inductor.

In one embodiment, the first part of the heat sink is electrically connected to a ground on the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
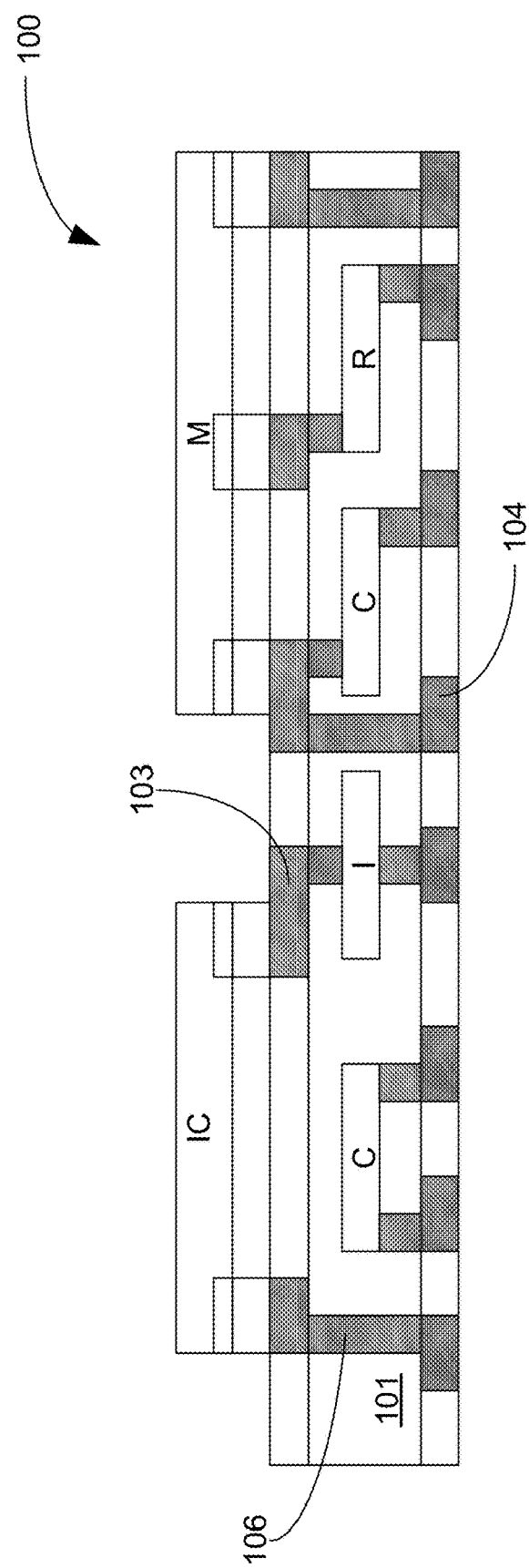
FIG. 1 illustrates a structure of an electronic module according to an embodiment of the present invention.

FIG. 1 illustrates a structure of an electronic module 100 according to an embodiment of the present invention. The electronic module 100 comprises a substrate 101 and a plurality of electronic components or discrete electronic components. The substrate 101 may be any type of substrate having conductive tracks. The substrate 101 may, for example, be a printed circuit board (PCB), a lead frame LF, a ceramic printed circuit board, etc. The plurality of electronic components may be active electronic components or passive electronic components. Active electronic components may rely on an energy source to perform their intended functions. Examples of the active electronic components may include diodes, transistors, integrated circuit, optoelectronic devices, insulated-gate bipolar transistors (IGBT), etc. Passive electronic components do not require a source of energy to perform their intended functions.

Figure 2:
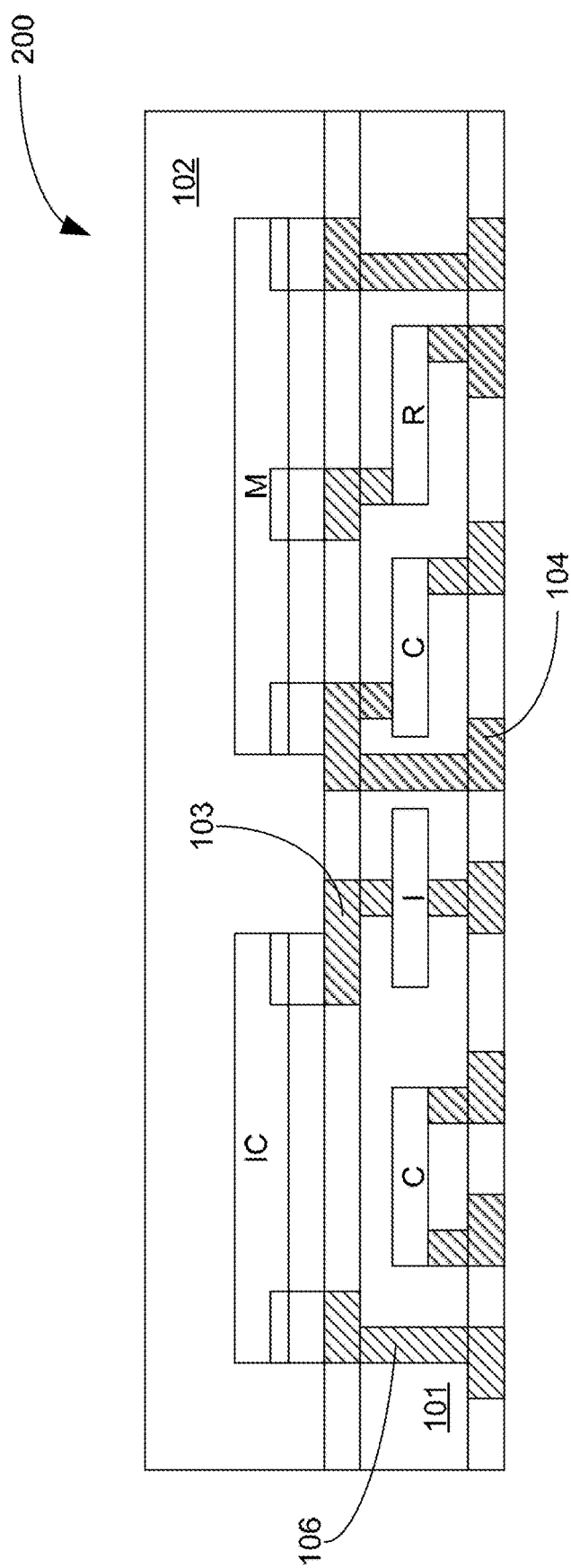
FIG. 2 illustrates the electronic module in FIG. 1 having a molding body.

Examples of the passive electronic components may include resistors, capacitors, inductors, etc. As shown in FIG. 1, a plurality of electronic components such as capacitors C, resistors R, and inductor I may be embedded into the substrate 101 and electronic components such as an integrated circuit IC and a transistor M may be disposed on the first side of the substrate 101. In one embodiment, the inductor I has a magnetic body and a coil encapsulated in the magnetic body. The integrated circuit IC and the transistor M may be coupled to the conductive tracks 103 of the first side of the substrate 101 through soldering or wire bonding. The second side of the substrate 101 may further comprise conductive tracks 104. The conductive tracks 104 on the second side of the substrate 101 may be used to couple the electronic module 100 to other devices or circuit boards. To complete the circuit connections of all electronic components of the electronic module 100, interposers 106 may be used to electrically couple electronic components embedded in the substrate 101 to other embedded electronic components, the conductive tracks 103 of the first side of the substrate 101, or the conductive tracks 104 of the second side of the substrate depending on the circuit design of the electronic module 100. Interposers 106 are conductive materials embedded within the substrate 101 to establish electrical connections between the layers of the substrate 101. In some other embodiments of the present invention, a molding body 102 may be disposed on the first side of the substrate 101. FIG. 2 illustrates the electronic module 200 having a molding body 102. The molding body 102 may be used to protect the electronic components from outside environment. In one embodiment, the electronic module is a DC-DC converters or a point of load (POL) converter.

Figure 3:
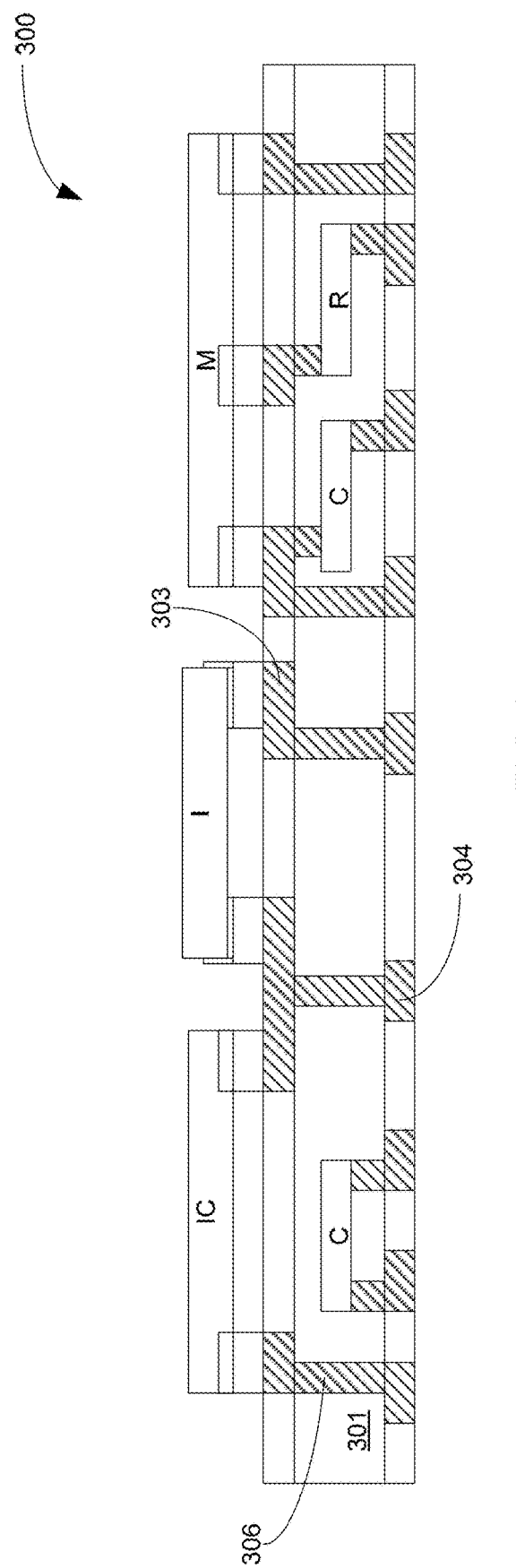
FIG. 3 illustrates a structure of an electronic module according to another embodiment of the present invention.

FIG. 3 illustrates a structure of an electronic module 300 according to another embodiment of the present invention. The electronic module 300 comprises a substrate 301 and a plurality of electronic components. The substrate 301 may be any type of substrate having conductive tracks. The substrate 301 may, for example, be a printed circuit board (PCB), a lead frame LF, a ceramic printed circuit board, etc. The plurality of electronic components may be active electronic components or passive electronic components. Active electronic components may rely on an energy source to perform their intended functions. Examples of the active electronic components may include diodes, transistors, integrated circuit, optoelectronic devices, insulated-gate bipolar transistors (IGBT), etc. Passive electronic components do not require a source of energy to perform their intended functions. Examples of the passive electronic components may include resistors, capacitors, inductors, etc. As shown in FIG. 3, a plurality of electronic components such as capacitors C and resistors R may be embedded into the substrate 301 and electronic components such as an integrated circuit IC and a transistor M may be disposed on the first side of the substrate 301.

Figure 4:
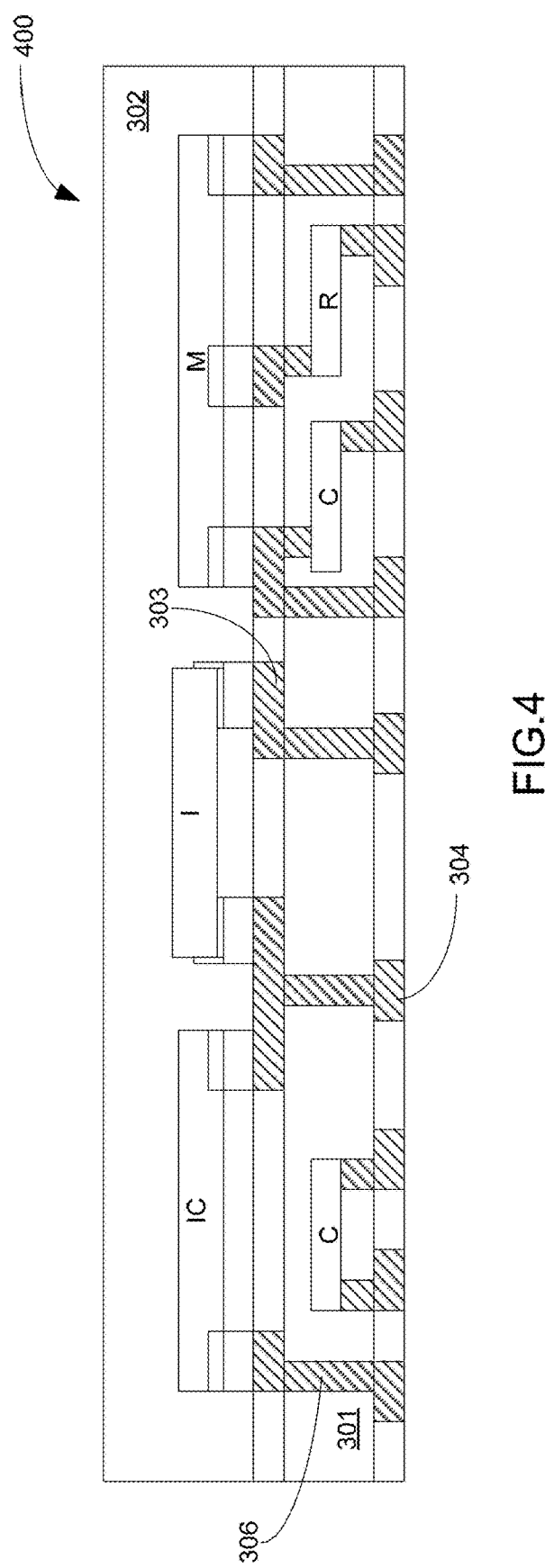
FIG. 4 illustrates the electronic module in FIG. 3 having a molding body.

Furthermore, passive electronic components such as an inductor I may be too large to be embedded in the substrate 301 or the electronic module 300 may require the inductor I be disposed on the first side of the substrate 301. In one embodiment, the inductor I has a magnetic body and a coil encapsulated in the magnetic body. As shown in FIG. 3, along with the integrated circuit IC and the transistor M, the inductor I may be disposed on the first side of the substrate 301. The inductor I, the integrated circuit IC and the transistor M may be coupled to the conductive tracks 303 of the first side of the substrate 301 through soldering or wire bonding. The second side of the substrate 301 may further comprise conductive tracks 304. The conductive tracks 304 on the second side of the substrate 301 may be used to couple the electronic module 300 to other devices or circuit boards. To complete the circuit connections of all electronic components of the electronic module 300, interposers 306 may be used to electrically couple electronic components embedded in the substrate 301 to other embedded electronic components, the conductive tracks 303 of the first side of the substrate 301, or the conductive tracks 304 of the second side of the substrate depending on the circuit design of the electronic module 300. Interposers 306 are conductive materials embedded within the substrate 301 to establish electrical connections between the layers of the substrate 301. In some other embodiments of the present invention, a molding body 302 may be disposed on the first side of the substrate 301. FIG. 4 illustrates the electronic module 400 having a molding body 302. The molding body 302 may be used to protect the electronic components from outside environment. In one embodiment, the electronic module is a DC-DC converters or a point of load (POL) converter.

Figure 5:
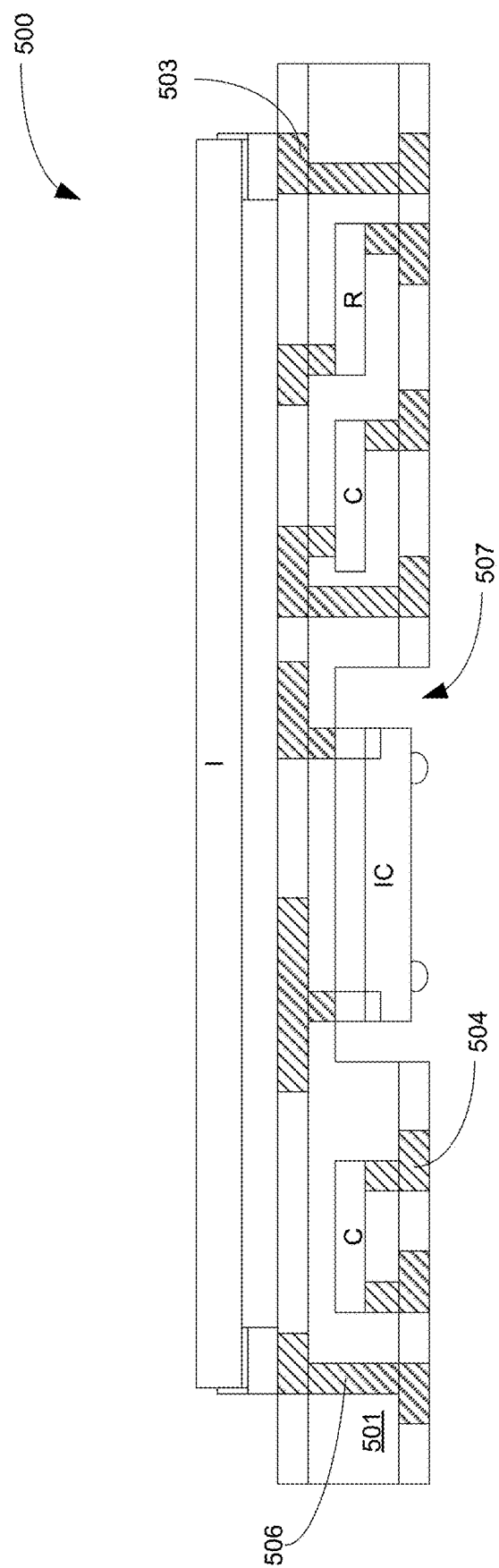
FIG. 5 illustrates a structure of an electronic module according to a further embodiment of the present invention.

FIG. 5 illustrates a structure of an electronic module 500 according to a further embodiment of the present invention. The electronic module 500 comprises a substrate 501 and a plurality of electronic components. The substrate 501 may be any type of substrate having conductive tracks. The substrate 501 may, for example, be a printed circuit board (PCB), a lead frame LF, a ceramic printed circuit board, etc. The plurality of electronic components may be active electronic components or passive electronic components. Active electronic components may rely on an energy source to perform their intended functions. Examples of the active electronic components may include diodes, transistors, integrated circuit, optoelectronic devices, insulated-gate bipolar transistors (IGBT), etc. Passive electronic components do not require a source of energy to perform their intended functions. Examples of the passive electronic components may include resistors, capacitors, inductors, etc.

As shown in FIG. 5, a plurality of electronic components such as capacitors C and resistors R may be embedded into the substrate 501 and electronic components such 5 such as an inductor I, that may be too large to be embedded in the substrate 501 or required by the electronic module 500 be disposed on the first side of the substrate 501, may be disposed on the first side of the substrate 501. The inductor I may be coupled to the conductive tracks 503 of the first side of the substrate 501 through soldering or wire bonding. In one embodiment, the inductor I has a magnetic body and a coil encapsulated in the magnetic body. The second side of the substrate 501 may comprise conductive tracks 504. The conductive tracks 504 on the second side of the substrate 501 may be used to couple the electronic module 500 to other devices or circuit boards. The second side of the substrate 501 may further comprise a recess area 507 wherein an integrated circuit IC may be disposed. To complete the circuit connections of all electronic components of the electronic module 500, interposers 506 may be used to electrically couple electronic components embedded in the substrate 501 to other embedded electronic components, the conductive tracks 503 of the first side of the substrate 501, or the conductive tracks 504 of the second side of the substrate depending on the circuit design of the electronic module 500. Furthermore, the interposers 506 may be used to electrically couple the first side of the integrated circuit IC in the recess area 507 to other electronic components of the electronic module 500. Interposers 506 are conductive materials embedded within the substrate 501 to establish electrical connections between the layers of the substrate 501. Furthermore, the integrated circuit IC may further have soldering balls or pins on the second side of the integrated circuit IC used to couple the integrated circuit IC to other devices or circuit boards. In some embodiments, the integrated circuit IC of the electronic module 500 may only be coupled through interposers 506 or may only be coupled using the soldering balls or pins. In one embodiment, the electronic module is a DC-DC converters or a point of load (POL) converter.

Figure 6:
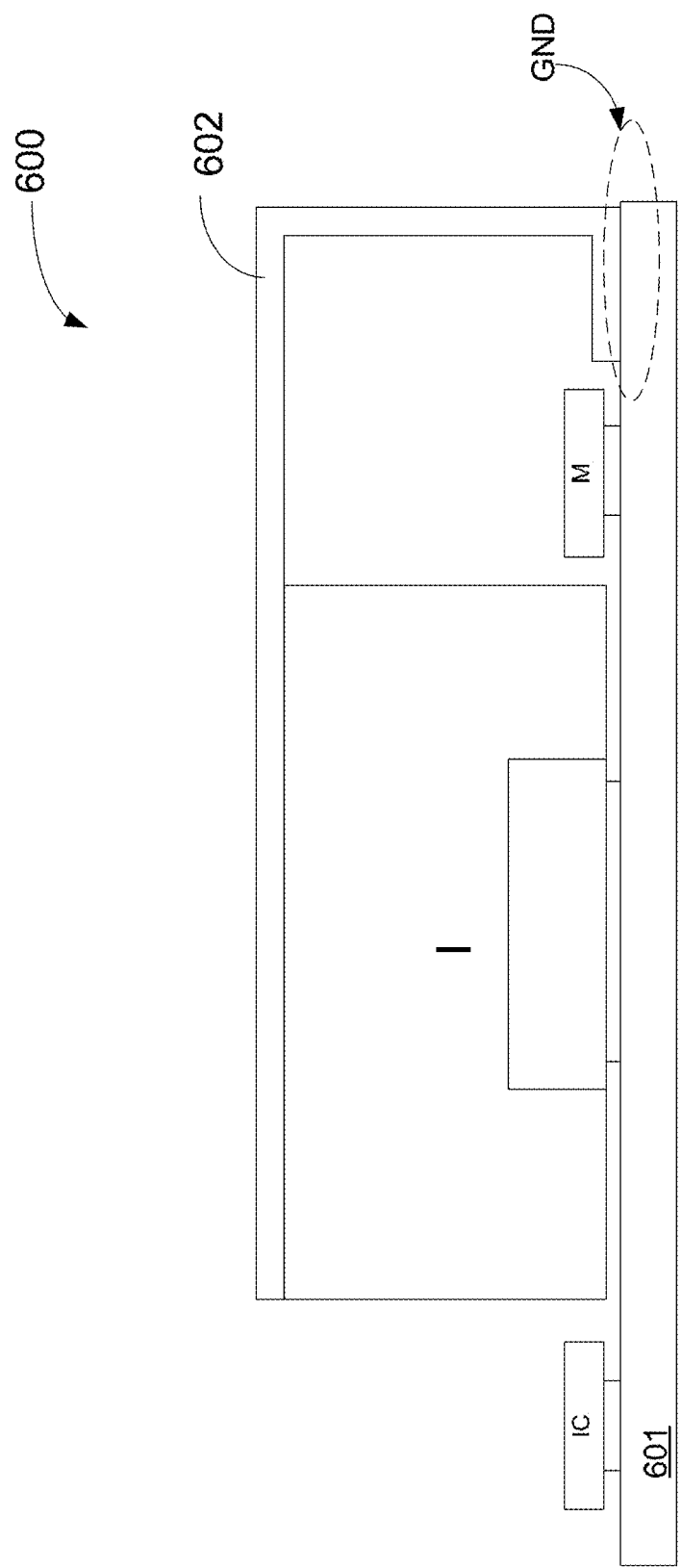
FIG. 6 illustrates a heat protected electronic module according to an embodiment of the present invention.

FIG. 6 illustrates a heat protected electronic module or electronic device 600 according to an embodiment of the present invention. The electronic module 600 is protected from heat may, for example, be any of the electronic module disclosed in FIG. 1, FIG. 3, and FIG. 5. The heat sink 602 may be a passive that transfers the heat generated by an electronic component into a coolant fluid in motion. The coolant fluid may be air. The heat sink 602 may be placed on electronic components that dissipate heat, such as integrated circuits, field effect transistors, insulated-gate bipolar transistor (IGBT), diodes, inductors, etc. The heat sink 602 may be formed using heat conductive materials. The heat conducting material may be a metal or non-metal material that may or may not conduct electricity. The heat sink 602 may be directly or indirectly attached to the electronic component. When indirectly attaching the heat sink 602 on the electronic component, a heat conducting polymer or thermal paste may be used. The heat sink 602 may also be attached to an electrode on the substrate 601 of the electronic module 600. By attaching the heat sink 602 to an electrode, the heat dissipation quality may be increased. In one embodiment, the electronic module 600 comprises an inductor having a body; a heatsink, wherein at least one part of the heatsink is disposed on a surface of the body of the inductor. In one embodiment, the inductor has a magnetic body and a coil encapsulated in the magnetic body. In one embodiment, the electronic module is a DC-DC converters or a point of load (POL) converter.

The amount of the increase of the quality of heat dissipation has a correlation to the area of the electrode where the heat sink 601 is attached to. In the field of electronics, it is well known that the ground electrode GND of a circuit may have the largest area as compared to other electrodes in the circuit. Thus, the heat sink 602 may be attached to the ground electrode GND of the electronic module 600 to get the optimal heat dissipation from the heat sink 602. In some other embodiments, the heat sink 602 may be directly attached to the substrate 601 of the electronic module 600. During the packaging of the electronic module, the electronic module may be enclosed by a molding body. In some embodiments, the heat sink may also be enclosed within the molding body together with the electronic module. Furthermore, the heat sink may also be able to help in protecting the electronic module from electromagnetic interferences (EMI). The heat sink may have different shapes, sizes and number of recesses. The increased number in recesses may ensure that there is no gap formed between the heat sink and the molding body. Also, the increased number in recesses may increase the binding of the molding body and the heat sink.

Figure 7:
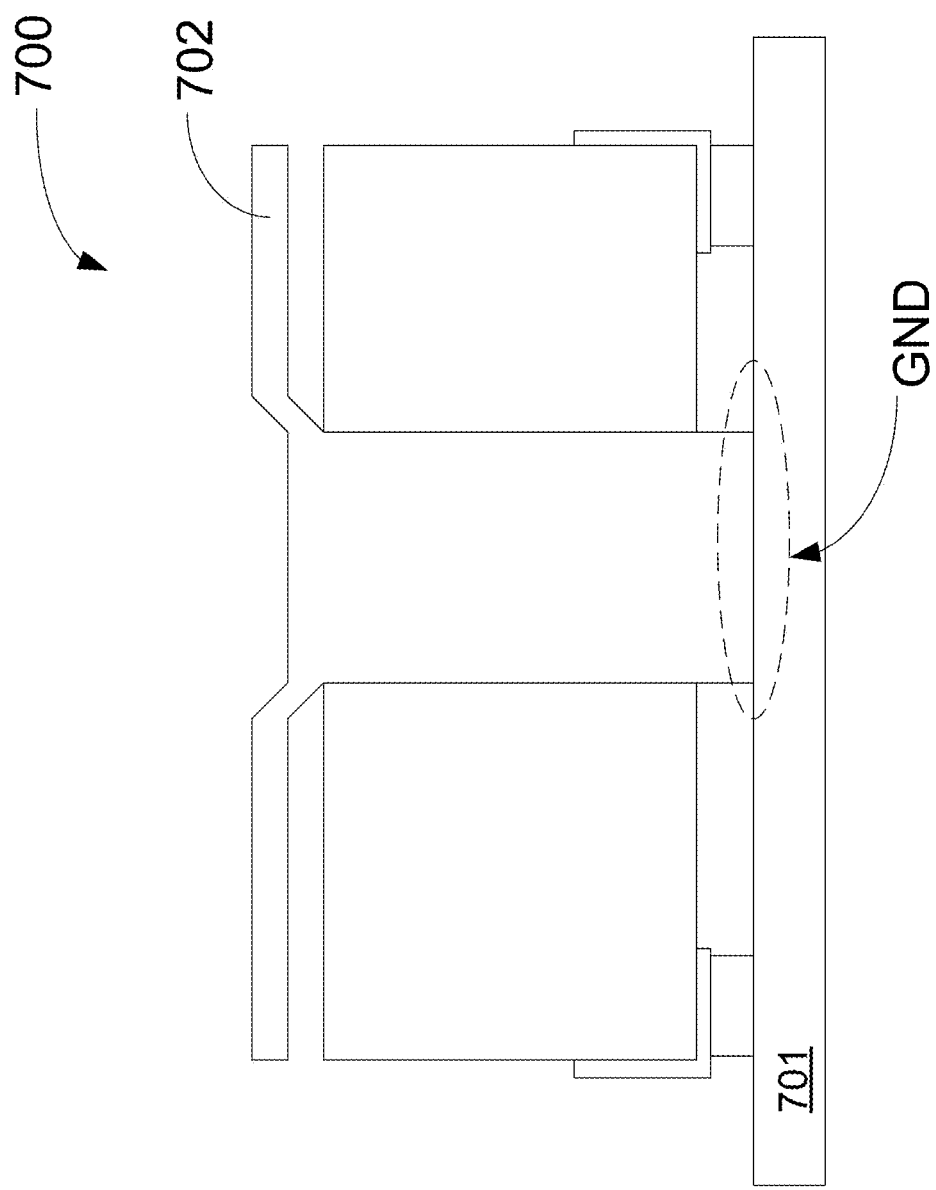
FIG. 7 illustrates a heat protected electronic module according to another embodiment of the present invention.

FIG. 7 illustrates a heat protected electronic module 700 according to another embodiment of the present invention. The electronic module 700 in FIG. 7 has a heat sink 702 with a different shape. The heat sink 702 may also be attached to an electrode on the substrate 701 of the electronic module 700. In some other embodiments, the heat sink 702 may be directly attached to the substrate 701 of the electronic module 700. In one embodiment, the electronic module 700 comprises an inductor having a body; a heatsink, wherein at least one part of the heatsink is disposed on a surface of the body of the inductor. In one embodiment, the inductor has a magnetic body and a coil encapsulated in the magnetic body. In one embodiment, the electronic module is a DC-DC converters or a point of load (POL) converter.

The present invention presents different embodiments of an electronic module. The structure of the electronic module presented may be used to form power management systems such as DC-DC converters and point of load (POL) converters. By placing electronic components on the first side of the substrate, on the second side of the substrate, and/or embedded in the substrate, the land pattern of the conductive tracks on the substrate greatly decreases. Thus, path resistance of the electronic module decreases and the effectiveness of the electronic components used increases. Furthermore, by having the electronic components in a stacked structure, the heat dissipation of the electronic module increases. The stacked structure, together with the high heat dissipating characteristic of the substrate and the flow field of the electronic module allowing dissipation of heat in both side of the substrate, the heat resistance of the electronic module is greatly increased. Thus, the structure of electronic module presented may not only save on space during manufacturing but also increase the effectiveness of the electronic module due to the decrease in land path and increased heat dissipation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic module, comprising:
 a unitary substrate, having a top surface and a bottom surface, wherein the unitary substrate is made of a single insulating layer extending from the top surface to the bottom surface of the unitary substrate, wherein there is no horizontally-placed conductive layer that is disposed between said top surface and said bottom surface of the unitary substrate, wherein a conductive layer is disposed on the top surface of the unitary substrate;

a plurality of first discrete electronic components, embedded inside the unitary substrate and electrically connected to the conductive layer, wherein a top surface of each of the plurality of first discrete electronic components is respectively located lower than the top surface of the unitary substrate, and a bottom surface of each of the plurality of first discrete electronic components is respectively located higher than the bottom surface of the unitary substrate;

a second discrete inductor, comprising a magnetic body and a coil encapsulated in the magnetic body, wherein the magnetic body is disposed over the top surface of the unitary substrate; and a molding body, disposed over the top surface of the unitary substrate and the plurality of first discrete electronic components to encapsulate the magnetic body of the second discrete inductor, wherein the second discrete inductor embedded in the molding body is electrically connected to a discrete electronic component of the plurality of first discrete electronic components via the conductive layer disposed on the top surface of the unitary substrate and a conductive via that is entirely disposed inside the unitary substrate.

2. The electronic module of claim 1, wherein the unitary substrate has a plurality of lateral surfaces connecting the top surface and the bottom surface of the unitary substrate, wherein each of two opposite side surfaces of the molding body is substantially aligned with a corresponding lateral surface of the unitary substrate.

3. The electronic module of claim 1, wherein the electronic module is a DC-DC converter or a point of load (POL) converter.

4. The electronic module of claim 1, further comprising: a plurality of third electronic components disposed over the top surface of the unitary substrate and encapsulated by the molding body.

5. The electronic module of claim 1, further comprising: a heat sink disposed on the second discrete inductor.

6. An electronic module, comprising:
a unitary substrate, having a top surface and a bottom surface, wherein the unitary substrate is made of a single insulating layer extending from the top surface to the bottom surface of the unitary substrate, wherein there is no horizontally-placed conductive layer that is disposed between said top surface and said bottom surface of the unitary substrate, wherein a conductive layer is disposed on the top surface of the unitary substrate, and a recess is formed in the unitary substrate;

a plurality of first electronic components embedded inside the unitary substrate and electrically connected to the conductive layer, wherein a top surface of each of the plurality of first electronic components is respectively located lower than the top surface of the unitary substrate, and a bottom surface of each of the plurality of first electronic components is respectively located higher than the bottom surface of the unitary substrate;

a second electronic component, disposed over the top surface of the unitary substrate, wherein the second electronic component is electrically connected to an electronic component of the plurality of first electronic components via said conductive layer disposed on the top surface of the unitary substrate and a conductive via that is entirely disposed inside the unitary substrate; and a third electronic component, comprising a plurality of electrodes disposed on a bottom surface of the third electronic component, wherein the third electronic component is disposed in the recess and the plurality of electrodes are exposed through the bottom surface of the unitary substrate for connecting with an external circuit.

7. The electronic module of claim 6, further comprising: a heat sink disposed on the second electronic component.

8. The electronic module of claim 7, wherein the heat sink is coupled to an electrode on the unitary substrate.

9. The electronic module of claim 6, further comprising: a molding body disposed on the top surface of the unitary substrate to encapsulate the second electronic component.

10. An electronic device, comprising:
an inductor having a body, wherein a recess is formed on a bottom surface of the body; and
a heatsink, disposed on the body of the inductor, wherein said heatsink comprises a first part disposed on a top surface of the body of the inductor, a second part extended from the first part and disposed on a lateral surface of the body of the inductor, and a third part extended from the second part and disposed in said recess, wherein said third part is disposed directly on the bottom surface of the body of the inductor, wherein at least one portion of the third part is in contact with and electrically connected to a ground electrode on a substrate.

11. The electronic device of claim 10, wherein the first part of the heat sink is adhered on the top surface of the body of the inductor by an adhesive layer.

12. The electronic device of claim 10, wherein the second part of the heat sink is adhered on the lateral surface of the body of the inductor by an adhesive layer.

13. The electronic device of claim 10, wherein the third part of the heat sink is adhered on the bottom surface of the body of the inductor by an adhesive layer.

* * * * *